(12) United States Patent
Rondier et al.

(10) Patent No.: US 7,417,857 B2
(45) Date of Patent: Aug. 26, 2008

(54) POWER-ELECTRONIC-COOLING DEVICE

(75) Inventors: Patrick Rondier, Montmagny (FR); Michel Fakes, Seclin (FR); Claudiu Vasilescu, Paris (FR); Richard Tellier, Paris (FR)

(73) Assignee: Valeo Equipements Electriques Moteur, Creteil Cedex (FR)

( * ) Notice: Subject to any disclaimer, the term of this patent is extended or adjusted under 35 U.S.C. 154(b) by 0 days.

(21) Appl. No.: 10/576,883

(22) PCT Filed: Oct. 29, 2004

(86) PCT No.: PCT/FR2004/002789

§ 371 (c)(1),
(2), (4) Date: Nov. 28, 2006

(87) PCT Pub. No.: WO2005/043621

PCT Pub. Date: May 12, 2005

(65) Prior Publication Data

US 2007/0163765 A1    Jul. 19, 2007

(30) Foreign Application Priority Data

Oct. 31, 2003    (FR) .................................. 03 12776

(51) Int. Cl.
H05K 7/20    (2006.01)
F28D 15/00    (2006.01)

(52) U.S. Cl. ..................... 361/699; 361/702; 165/80.4; 165/104.33; 174/15.1

(58) Field of Classification Search ......... 361/699–703; 29/890.03; 165/80.4, 104.26, 104.33, 153; 174/252, 15.1

See application file for complete search history.

(56) References Cited

U.S. PATENT DOCUMENTS

| | | | | |
|---|---|---|---|---|
| 2,821,014 A * | 1/1958 | Miller | ......................... | 428/654 |
| 5,103,374 A * | 4/1992 | Azar | .......................... | 361/689 |
| 5,361,828 A * | 11/1994 | Lee et al. | .................. | 165/109.1 |
| 6,397,935 B1 | 6/2002 | Yamamoto et al. | | |
| 6,648,062 B2 * | 11/2003 | Fukazu et al. | ............... | 165/80.3 |
| 6,661,658 B2 * | 12/2003 | Capriz et al. | ................. | 361/690 |
| 6,662,859 B2 * | 12/2003 | Strahle et al. | .......... | 165/104.13 |
| 6,679,315 B2 * | 1/2004 | Cosley et al. | ............... | 165/80.4 |
| 6,717,115 B1 * | 4/2004 | Pfahnl et al. | .............. | 219/444.1 |
| 6,929,058 B2 * | 8/2005 | Liu et al. | .................... | 165/80.3 |
| 6,935,412 B2 * | 8/2005 | Mueller | ....................... | 165/80.4 |
| 6,942,019 B2 * | 9/2005 | Pikovsky et al. | ........... | 165/80.4 |
| 6,961,244 B2 * | 11/2005 | Tsuchiya et al. | ............. | 361/710 |
| 7,068,507 B2 * | 6/2006 | Pfeifer et al. | ................ | 361/699 |
| 2003/0178179 A1 | 9/2003 | Brost | | |
| 2003/0178182 A1* | 9/2003 | Pikovsky et al. | ........... | 165/80.4 |

FOREIGN PATENT DOCUMENTS

EP    0 124 428 A    11/1984
IE    55621 B1 *    11/1990

* cited by examiner

Primary Examiner—Jayprakash N Gandhi
Assistant Examiner—Robert J Hoffberg
(74) Attorney, Agent, or Firm—Berenato, White & Stavish

(57) ABSTRACT

A device which is used to cool the power electronics of a vehicle, by circulating a liquid through a cooling circuit which is mounted under a plate bearing the power electronics. According to the invention, the cooling circuit can include deflectors and/or turbulators in order to increase the exchange coefficient between the cooling circuit and the cooling liquid. The invention also relates to a method of producing the device.

18 Claims, 3 Drawing Sheets

POWER-ELECTRONIC-COOLING DEVICE

FIELD OF THE INVENTION

The invention concerns a device for cooling power electronics, in particular power electronics for controlling an alternator or alternator/starter on a motor vehicle. The inventions finds applications in the field of power electronics. It can be applied to the power electronics of motor vehicles. In particular it can apply to DC/DC converters for motor vehicles.

PRIOR ART

In a motor vehicle, the alternator converts a rotation movement of the inductor rotor, driven by the thermal engine of the vehicle, into an electric current induced in the stator windings.

At the present time there exist reversible alternators which can constitute an electric motor for driving the thermal engine of the vehicle in rotation via the shaft of the rotor. Such a reversible alternator is called an alternator/starter. It converts mechanical energy into electrical energy and vice versa. Thus an alternator/starter can start the engine of the motor vehicle and constitute an auxiliary motor assisting the thermal engine of the vehicle to drive the said motor vehicle.

The alternator, or alternator/starter, of the vehicle is partly controlled by power electronics, which can form a power module separate from the alternator and connected to the latter by means of electric cables.

In general, this power module (like the majority of power modules present in a vehicle) comprises at least one power electronics component brazed or bonded to a substrate. This substrate can be a substrate of the DBC type (Direct Bonded Copper, in English terms). Such a substrate comprises three layers: a first layer consists of an etched metal track forming the electrical connections of the circuit, a second intermediate layer is a plate of electrically insulating material such as a ceramic, and a third layer is a metal plate consisting of copper or nickel-plated copper. The assembly consisting of the DBC substrate and the power electronics component is in its turn brazed to a copper plate, forming a mechanical support and heat dissipater.

The substrate can also be of the IMS type (Insulated Metal Substrate). In this case, the ceramic plate is replaced with a resin plate able to support a first layer consisting of a very fine metal copper track. The third heat dissipation layer can, in this case, consist of an aluminum metal plate.

The metal plate, made from aluminum for the IMS substrate and copper for the DBC substrate, comprises a cooling phase intended to be put in contact with air cooling means, generally external to the power module.

These cooling means are generally a dissipater with fins placed under the power module. The ambient air that circulates between the fins of this dissipater ensures the cooling of the power module. However, this ambient air may be heated, for example, by the various surrounding elements and circuits which also diffuse heat. Such air cooling means may also have insufficient cooling capacity, in particular when the power module generates high power and consequently dissipates a great deal of heat.

DISCLOSURE OF THE INVENTION

The aim of the invention is precisely to remedy the drawbacks of the art disclosed above. To this end, it proposes a device for cooling power electronics, for example intended for managing or controlling an alternator or an alternator/starter, by the circulation of a liquid in a cooling circuit situated under the power electronics, this liquid being able to be water or a liquid dedicated to cooling.

To this end, the invention concerns a device for cooling power electronics comprising a support plate on which the power electronics are mounted, characterised in that it comprises a circuit for cooling by the circulation of a liquid, mounted under the support plate.

The invention is advantageously supplemented by the following various characteristics, taken alone or in all their possible combinations:

the cooling circuit comprises a liquid inlet channel, a liquid outlet channel and channels for the circulation of liquid between the inlet channel and the outlet channel;

the cooling circuit comprises deflectors situated in the liquid circulation channels.

These deflectors guide the fluid properly in the channels and thus reduce pressure drops. These deflectors also improve the cooling by increasing the heat exchange surfaces.

The cooling circuit comprises turbulators distributed in the liquid circulation channels in order to improve further the cooling;

the channels of the cooling circuit are produced by pressing a first metal plate, which constitutes a simple and economical way of producing a cooling device, this device being able to comprise a complex network of channels, deflectors and turbulators. In addition, producing the cooling channels by pressing makes it possible to obtain a lightweight cooling device;

the cooling circuit is fixed under the support platform by brazing. Thus the cooling channels are produced by a simple brazing operation;

the cooling circuit comprises a second metal plate fixed between the support plate and the first metal plate. This second plate thus makes it possible to easily increase the thickness of the support plate. The second metal plate is flat, brazed to the first metal plate;

the cooling circuit comprises a metal manifold connected to the cooling circuit;

the metal is aluminum;

this device is assembled by brazing.

The invention also concerns a method for manufacturing this power electronics cooling device. This method is characterised by the fact that it comprises the following operations:

producing a cooling circuit by pressing a first metal plate, brazing the cooling circuit to a support plate for the power electronics, and brazing at least one inlet and outlet manifold for the cooling liquid.

DETAILED DESCRIPTION OF EMBODIMENTS OF THE INVENTION

Figure 1:
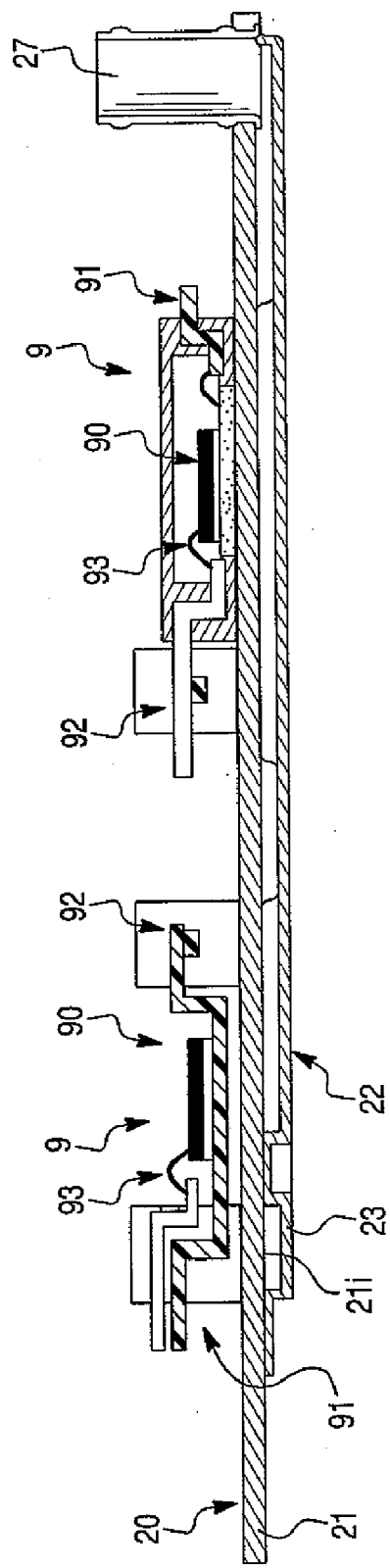
FIG. 1 depicts the power electronics of an alternator with a cooling device according to the invention.

FIG. 1 depicts an example of a power electronics circuit for an alternator or alternator/starter mounted on a cooling device according to the invention. In the example in FIG. 1, the power electronics, or power module, is referenced 9. These power electronics 9 can comprise for example a substrate of the DBC type on which there are mounted one or more integrated circuits 90. These integrated circuits 90 can be connected for example to discrete components such as capacitors 92. The connection can be made, for example, by connection wires 93 (wire bonding, in English terms) or by means of conductive tracks 91, referred to as bus bars.

The power electronics assembly 9 is fixed to a support plate referred to as the support plate 21.

Naturally the power module 9 depicted in this FIG. 1 is only one example of a power module. Other power modules can of course be mounted on the support plate 21 of the cooling device of the invention. In general terms, the power electronics can be mounted on the support plate in the same way as on a dissipating plate of the prior art.

FIG. 1 shows the power electronics 9 mounted on the cooling device of the invention. This cooling device, referenced 20, comprises the support plate 21 on which the power electronics 9 are mounted and fixed. It also comprises a cooling circuit 22 situated under the support plate 21. The cooling circuit 22 comprises a pressed plate 23, or first plate, which comprises channels intended for the circulation of a cooling liquid such as water. This pressed plate is positioned under the support plate 21. In fact it is the pressed plate itself that forms, through its pressing patterns and through the bottom face 21i of the support plate 21, the water circulation channels. In this way, the circulation of the cooling liquid on this pressed plate 23 and consequently under the plate 21 supporting the power electronics cools the power electronics.

As has just been stated, the cooling liquid can be water. In the remainder of the description water cooling will be spoken of. Naturally, however, it is possible to use, in the device of the invention, all known cooling fluids.

FIG. 1 shows that the cooling device of the invention also comprises at least one water inlet and outlet manifold 27. This manifold 27 makes it possible respectively to introduce and discharge the water from the cooling circuit 22.

Figure 2:
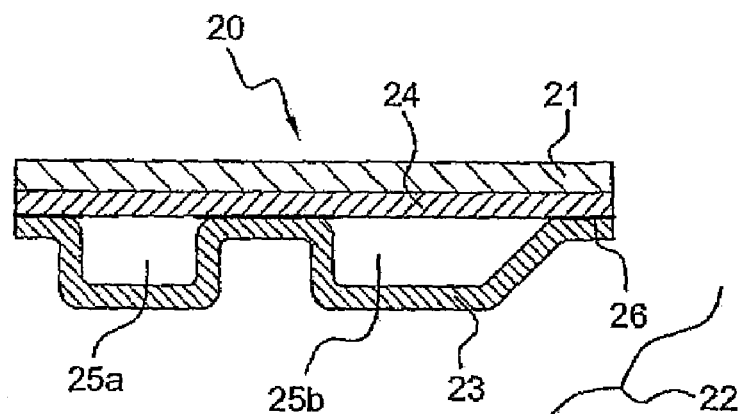
FIG. 2 depicts the cooling circuit of the device of the invention.

FIG. 2 shows, in more detail, the cooling device of the invention. As seen previously, the cooling device 20 of the invention comprises a support plate 21 on which the power electronics to be cooled are mounted. In the embodiment in FIG. 1 the cooling circuit 22 placed directly under the support plate 21 has been shown.

In one embodiment of the invention, the cooling circuit 22 comprises, in addition to the pressed plate 23, a second plate 24 fixed above the pressed plate 23. This second plate 24 is flat, fixed under the support plate 21. In this case, the flat plate 24 is connected to the bottom face 21i of the support plate 21 by a technique that can be identical to the technique of connecting the pressed plate 23 with the flat plate 24 described below.

The assembly consisting of the support plate 21 and the flat plate 24 forms a sole plate for the power electronics. This second intermediate plate 24, placed between the support plate 21 and the pressed plate 23, gives a support plate of greater thickness. It could be envisaged having several intermediate plates. The assembly consisting of the support plate and the intermediate plate or plates 24 constitutes a support plate on which on one side the power electronics to be cooled are mounted and on the other side the cooling device for the power electronics is placed. This second plate also carries the manifolds as described below.

According to one embodiment of the invention, the pressed plate 23 is fixed to the flat plate 24 by brazing. The reference 26 represents the brazing joints used for assembling the pressed plate 23 and the flat plate 24 by brazing. In the embodiment in FIG. 1, the pressed plate 23 is connected directly to the support plate 21, by a brazing technique. This brazing technique consists of assembling two plates made from the same material, for example aluminum, separated by a plating layer, or brazing join, deposited on one of the plates. These two plates are then heated in an oven at the melting temperature of the plating. The plating layer, in the case where the two plates to be brazed are aluminum, is also made from aluminum but has a melting point less than that of the two plates to be connected. This plating layer, here made from aluminum, is deposited according to a co-lamination technique on one face of at least one of the two plates to be brazed, this face being opposite to the other face to be brazed. The plating being of the same material as the two plates to be connected, there is no addition of a thermal barrier, which makes it possible to obtain good thermal conductivity.

The absence of an intermediate plate 24, according to this technique of brazing by means of co-laminated plates, co-laminated plate being a plate provided with its plating, then either the support plate 21 has plating on its bottom face or the pressed plate 23 has plating on its top face.

The support plate 21 and the flat plate 24 can have different thicknesses. Likewise, the thickness of the pressed plate 23 can be different from that of the flat plate 24 and the support plate 21.

The support plate can be produced by a single metallic plate with a thickness of around 1 to 10 mm. It can also be produced from several assembled plates, for example by brazing as described above.

Each of the plates, flat plate or pressed plate, can itself be produced from several assembled plates, for example by brazing.

The pressed plate 23 has a thickness of around 0.5 to 3 mm. The top face of the pressed plate, that is to say the plate that is assembled with the support plate 21 or flat plate 24, can serve as an addition of material during assembly by brazing. This addition of material consists of the plating in contact with the other plate or support to be brazed.

In other words, the parts of the pressed plate which do not form the channels 28 are in direct contact with the flat plate 24 or support plate 21. These parts in contact form the brazing joint 26.

Advantageously, the pressed plate 23 and flat plate 24 are produced in a metal material such as aluminum. Aluminum has the advantage of having good heat conductivity. It thus enables the device of the invention to have a good exchange coefficient.

Like the plates 23 and 24, the support plate 21 can be produced from a metal material, for example aluminum. Producing the whole of the cooling device from the same material which is a good conductor of heat allows better propagation of the heat from the support plate 21 as far as the pressed plate 23. In other words, a single-material device makes it possible to obtain better conduction of heat.

As can be seen in FIG. 2, the pressed plate 23 forms, by means of its pressing patterns, water circulation channels. Examples of these channels are referenced 25a and 25b. These channels constitute sealed pockets of water, the water in these pockets being in permanent movement. The sealing of these pockets 23 and 24 and, more generally, the sealing of the cooling circuit is provided by the brazing joints 26, the thickness and surface area of which have a direct influence on the resistance to pressure.

The size and number of channels are determined so as to optimise the exchange coefficient between the support plate 21 and the cooling circuit 22. Likewise, the speed of the water in the channels is chosen so as to optimise this exchange coefficient. This is because, in the invention, it is proposed to modify the speed of the water by inserting, in the circulation channels, guidance deflectors 31 which on the one hand guide the water in the channels and on the other hand modify the water flow rate in these channels. It is thus possible to optimise the speed of the water in the cooling circuit 22.

Figure 3:
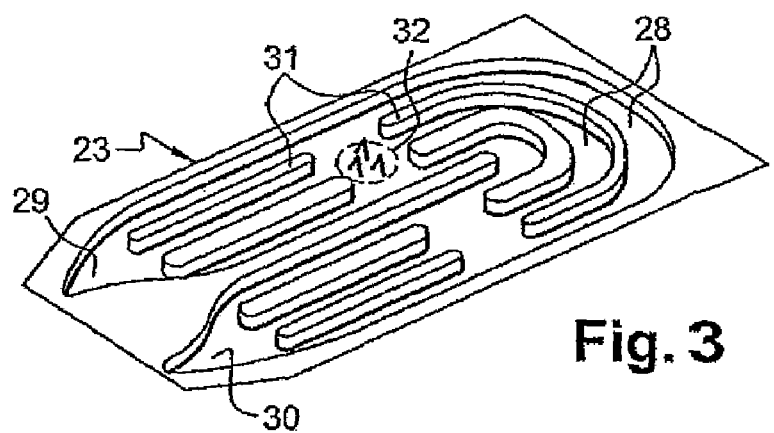
FIG. 3 depicts an example of a pressed plate of the cooling circuit of FIG. 2.

FIG. 3 depicts an example of a pressed plate 23. In this example, the water circulation channels are referenced 28. They can correspond approximately to the channels 25a and 25b shown in FIG. 2. The pressed plate 23 comprises, in addition to the water circulation channels 28, a water inlet channel 29 and a water outlet channel 30. The water inlet channel 29 introduces water into the channels 28 and the water outlet channel 30 discharges water out of the channels 28. Thus the water enters the cooling circuit 22 through the inlet channel 29 and then travels through the circulation channels 28 as far as the outlet channel 30.

The channels 28 can comprise deflectors 31 forming guide rails for the water. Guiding the water in the channels reduces pressure drops and in particular drops through change of direction due in particular to the bends in the channels. Moreover, the presence of these deflectors increases the area of contact between the water and the pressed plate 23, which increases the cooling capacity of the device.

The water circulation channels 28 preferably have constant cross sections in order to avoid pressure drops. They may also comprise turbulators 32. These turbulators are small elements inserted in the channels 28 in order to create turbulence, that is to say water movements. They may be produced by means of small elements of various shapes such as small peaks or small holes placed in the channels. These turbulators increase the turbulence of the water through two effects: either through the passage of the water through holes, or through the passage of the water through narrow grooves. Then an acceleration is obtained in the circulation of the water. This turbulence has the advantage of offering a better exchange coefficient between the water and the cooling circuit and therefore more rapid cooling of the power electronics.

The turbulators 32, like the deflectors 31, are preferably produced at the time of pressing of the pressed plate 23, that is to say they are produced at the same time as the channels 28, 29 and 30.

Figure 4:
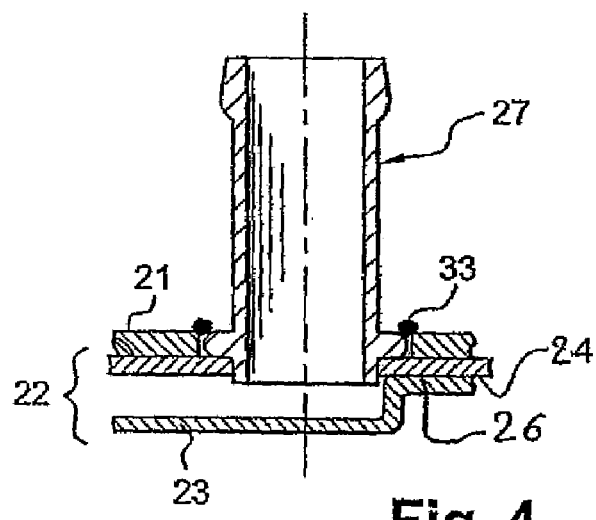
FIG. 4 depicts the joints between the cooling liquid inlet and outlet manifold and the cooling circuit.

FIG. 4 depicts by way of example a detail of the cooling device of the invention. More precisely, the manifold 27 which provides the admission and discharge of the water in the cooling circuit 22 has been shown. This manifold 27 is a kind of metal tube, for example made from aluminum, fixed to the ends of the water inlet 29 and outlet 30 channels. This manifold 27 is placed perpendicular to the cooling circuit 22 and more precisely to the pressed plate 23.

The manifold 27 is mounted for example on the cooling circuit 22 in the following way:
the manifold is first of all connected to the sole plate formed by the support plate 21 and/or the flat plate 24, by tight mounting or light crimping;
it is then brazed so as to be integral with the cooling circuit 22.

The manifold 27 can be brazed at the same time as the brazing of the pressed plate 23 by the use of plating situated on the top face of the plate 24.

In the case where the cooling device does not have any flat plate 24, the manifold 27 is then fixed directly to the support plate 24, for example by means of a brazing bead.

A brazing ring 33 can also be provided between the manifold and the sole plate in order to provide an even better seal for the assembly.

Figure 5:
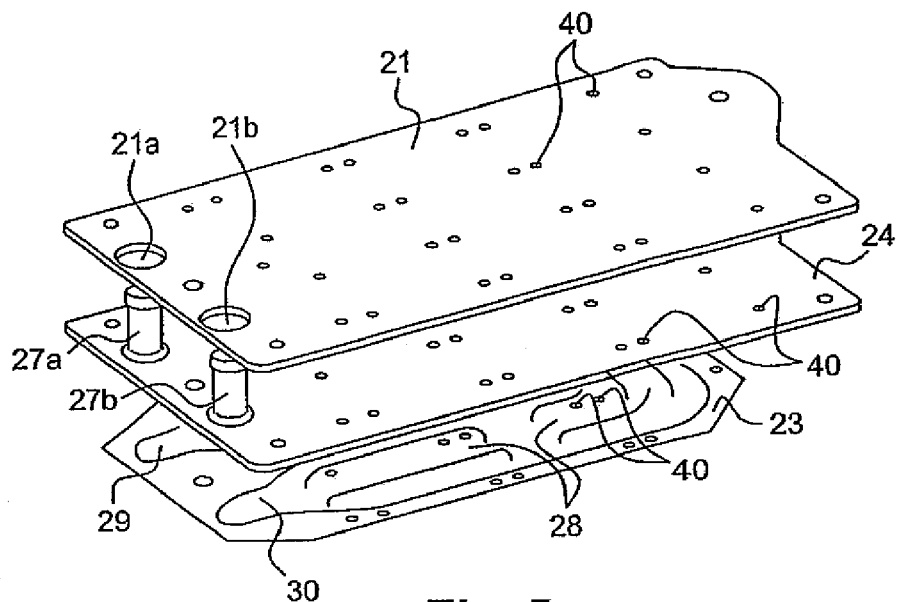
FIG. 5 depicts an example of a cooling device of the invention in an exploded view.

FIG. 5 depicts an exploded perspective view of an example of a cooling device of the invention. This FIG. 5 shows the various plates forming the cooling device, in particular the support plate 21, the flat plate 24 and the pressed plate 23. According to the embodiment in FIG. 5, the manifold 27 has a water inlet manifold 27a and a water outlet manifold 27b, parallel to each other. These two manifolds 27a and 27b are mounted on the flat plate 24. When the various plates are assembled, the manifolds 27a and 27b are introduced, respectively, into the orifices 21a and 21b of the support plate 21. The pressed plate 23 is then placed under the flat plate 24 so that the manifold 27a is opposite the inlet channel 29 of the pressed plate 23 and the manifold 27b is opposite the outlet channel 30 of the pressed plate 23.

Figure 6:
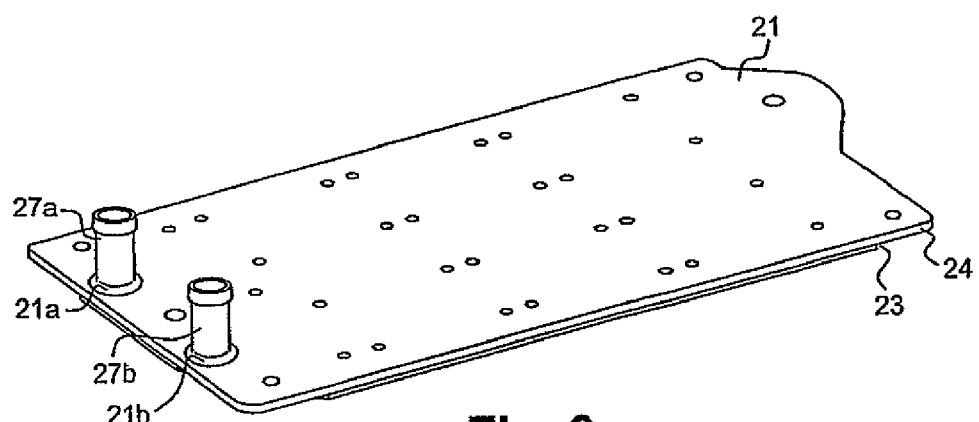
FIG. 6 depicts the cooling device of FIG. 5 in a perspective view.

FIG. 6 depicts the embodiment of the cooling device of the invention in FIG. 5, when the various plates are assembled as explained above. There can therefore be seen, in this FIG. 6, the support plate 21 assembled with the flat plate 24 and the pressed plate 23. The inlet manifold 27a passes through the orifice 21a in the support plate 21 and the outlet manifold 27b passes through the orifice 21b in the said support plate 21, allowing respective connection to external water inlet and water discharge pipes.

In the absence of an intermediate plate 24, the assembly depicted in FIGS. 5 and 6 is identical except that the manifolds are mounted on the support plate 21.

In a variant of the invention, the manifold 27 can be in a single piece with a water inlet and a water outlet. In this case, the shape of the water inlet and outlet channels of the pressed plate 23 is adapted to receive and discharge the water from/through this piece.

In another variant of the invention, the manifold 27 can comprise several water inlet manifolds and/or several water outlet manifolds.

For easier integration of the various elements on the support plate 21 and in particular for the insertion of the power electronics 9, the various parts to be assembled can be punched in advance, that is to say marked with a punch of chosen shape. This punch may for example be an orifice 40 with a particular diameter or shape. This punch creates a mechanical mark on each piece. Thus, by superimposing the punches of each piece, for example by means of flanges passing through these aligned orifices of each plate, it is then certain that the pieces are correctly superimposed. This punching thus makes it possible to centre the pieces with respect to one another, in particular during the brazing operation.

This punching can be carried out at the same time as the piercing of orifices intended for the mounting of the electronic module or modules 9 in the support plate 21. This is because, in order to fix the electronic module 9 in the cooling device, it is necessary to pierce orifices in at least part of the cooling device in order to make it possible to fit therein positioning spikes present under the electronic module, or to allow the passage of fixing screws for the electronic modules. These orifices can be produced either in the support plate 21 or in the sole plate 21/24, or in the whole of the cooling device. It is the latter case that is shown in FIGS. 5 and 6, where the orifices are referenced 40. The choice of the piercing of one or more plates of the cooling device is made according to the thickness of each of the plates and support plate.

Carrying out such a punching may make it possible to avoid carrying out expensive additional machining after brazing of the device.

The cooling device that has just been described can be fabricated with a brazing technique. In this case, first of all a cooling circuit 22 is produced by pressing a first metal plate in order to obtain a pressed plate 23, a manifold 27 is fixed to a flat plate 24, the flat plate 24 is placed on the pressed plate 23, a support plate 21 is placed on the flat plate 24, these three plates are assembled and are inserted in an oven where the temperature is raised to the required melting point.

It should be noted that a plating layer was previously deposited by co-lamination on at least one of the plates in order to allow fusion between the plates, in pairs. For example, a plating layer is disposed on the bottom face of the support plate 21 and on the bottom face of the flat plate 24 in order to ensure fusion between respectively the support plate 21 and the flat plate 24 and between the flat plate 24 and the pressed plate 23.

In another embodiment, for example only the intermediate plate 24 has plating on both faces.

Preferably, the top face of the support plate 21, that is to say the face that is in contact with the power electronics, is devoid of any plating in order to guarantee a better surface finish, after brazing.

The brazing of the pressed plate 23 on the flat plate and the brazing of the flat plate on the support plate can be carried out simultaneously, as explained previously. Likewise, the manifold 27 can be brazed on the cooling circuit 22 at the same time as the brazing of the plates 23 and 24. The brazing can however be carried out in several steps, for practical reasons.

The brazing of the various plates of the cooling device of the invention makes it possible to obtain metallurgical continuity, and therefore thermal continuity, between these various plates.

In addition, the brazing technique, on a material such as aluminum, makes it possible to obtain a cooling device that is relatively lightweight compared with current devices.

The cooling device of the invention can also be produced by techniques other than brazing, for example by screen printing of the patterns of the cooling circuit on a metal plate, for example made from aluminum. It then consists of assembling this screen-printed plate with a flat plate and a support plate and laminating the assembly by means of a laminator. Finally, the screen-printed plate is put under pressure, for example with compressed air routed through the manifold 27, so that the non screen printed areas of the screen-printed plate separate from the flat plate, thus forming the water circulation channels.

Other techniques for producing the cooling device of the invention can also be envisaged.

The invention claimed is:

1. A device for cooling power electronics, comprising:
a support plate on which the power electronics are mounted, said support plate comprising at least one orifice,
a pressed metal plate including liquid circulation channels press-formed in said pressed metal plate, said channels defining at least partially a cooling circuit for cooling the power electronics by circulation of a liquid in the channels;
an intermediate plate sandwiched between said support plate and said pressed metal plate; and
at least one manifold fixed to the intermediate plate and connected to the cooling circuit, said at least one manifold being introduced in said at least one orifice of the support plate.

2. The cooling device according to claim 1, wherein the cooling circuit comprises a liquid inlet channel, a liquid outlet channel and said circulation channels for the circulation of the liquid between the inlet channel and the outlet channel.

3. The cooling device according to claim 2, wherein the cooling circuit comprises deflectors situated in the liquid circulation channels.

4. The cooling device according to claim 3, wherein the cooling circuit further comprises turbulators distributed in the liquid circulation channels.

5. The cooling device according to claim 2, wherein the cooling circuit comprises turbulators distributed in the liquid circulation channels.

6. The cooling device according to claim 1, wherein the manifold is made of metal.

7. The cooling device according to claim 1, wherein the pressed metal plate is made of aluminum.

8. The cooling device according to claim 1, wherein the pressed metal plate is fixed directly by brazing to the intermediate plate.

9. The cooling device according to claim 8, wherein at least one of the pressed metal plate and the intermediate plate comprises plating by co-lamination.

10. The cooling device according to claim 9, wherein the pressed metal plate and the intermediate plate are made from aluminum.

11. The cooling device according to claim 1, wherein the intermediate plate carries the manifold.

12. The cooling device according to claim 1, wherein the intermediate plate is fixed directly by brazing to the support plate.

13. The cooling device according to claim 12, wherein at least one of the intermediate plate and the support plate comprises plating by co-lamination.

14. The cooling device according to claim 13, wherein the intermediate plate and the support plate are made of aluminum.

15. An alternator or alternator/starter for a motor vehicle, comprising a power electronics cooling device according to claim 1.

16. A method of manufacturing a power electronics cooling device, comprising the steps of:
producing a cooling circuit by pressing a metal plate to integrally and homogenously form liquid circulation channels in said pressed metal plate,
providing a support plate on which the power electronics are mounted, the support plate having at least one orifice,
brazing at least one manifold on an intermediate plate,
mounting the support plate on the intermediate plate such that the manifold on the intermediate plate is introduced in the orifice of the support plate, and
mounting the intermediate plate on the pressed metal plate such that the manifold is connected to the cooling circuit.

17. The method according to claim 16, wherein the step of producing the cooling circuit by pressing of the metal plate comprises the pressing of deflectors and/or turbulators into the metal plate.

18. A device for cooling power electronics, comprising:
a support plate on which the power electronics are mounted, said support plate being planar;

a metal plate including circulation channels formed in said metal plate, wherein a cooling circuit for cooling by circulation of a liquid is defined by said liquid circulation channels, wherein a plurality of deflectors are placed in the cooling circuit in order to guide the circulation of the liquid, and wherein turbulators are placed in the cooling circuit in order to accelerate the circulation of the liquid, said turbulators being distributed between two deflectors along a fluid circulation direction in the cooling circuit.

* * * * *